United States Patent [19]
Wege et al.

[11] Patent Number: 6,153,492
[45] Date of Patent: Nov. 28, 2000

[54] METHOD FOR IMPROVING THE READABILITY OF ALIGNMENT MARKS

[75] Inventors: Stephan Wege, Weissig; Peter Lahnor, Dresden, both of Germany

[73] Assignee: Infineon Technologies AG, Munich, Germany

[21] Appl. No.: 09/492,656

[22] Filed: Jan. 27, 2000

[30] Foreign Application Priority Data

Jan. 27, 1999 [DE] Germany .............. 199 03 196

[51] Int. Cl.$^7$ .................................................. H01L 21/76
[52] U.S. Cl. ............................................ 438/401; 438/462
[58] Field of Search .................................. 438/401, 462, 438/800; 257/797, 798

[56] References Cited

U.S. PATENT DOCUMENTS

| | | |
|---|---|---|
| 5,640,053 | 6/1997 | Caldwell ............................ 257/797 |
| 5,663,099 | 9/1997 | Okabe et al. . |
| 5,786,260 | 7/1998 | Jang et al. . |
| 5,911,108 | 6/1999 | Yen .......................................... 438/401 |

*Primary Examiner*—Charles Bowers
*Assistant Examiner*—Craig Thompson
*Attorney, Agent, or Firm*—Herbert L. Lerner; Laurence A. Greenberg; Werner H. Stemer

[57] ABSTRACT

The invention describes a method for improving the readability of alignment marks on semiconductor wafers during multilayer metallization. Metal located in the alignment marks is etched back for the purpose of uncovering the edges of the alignment marks after the deposition of metal and subsequent CMP step. In the alternative, the oxide in the immediate vicinity of the alignment marks is etched back in a recess etching step until the metal in the alignment mark is partly uncovered.

22 Claims, 3 Drawing Sheets

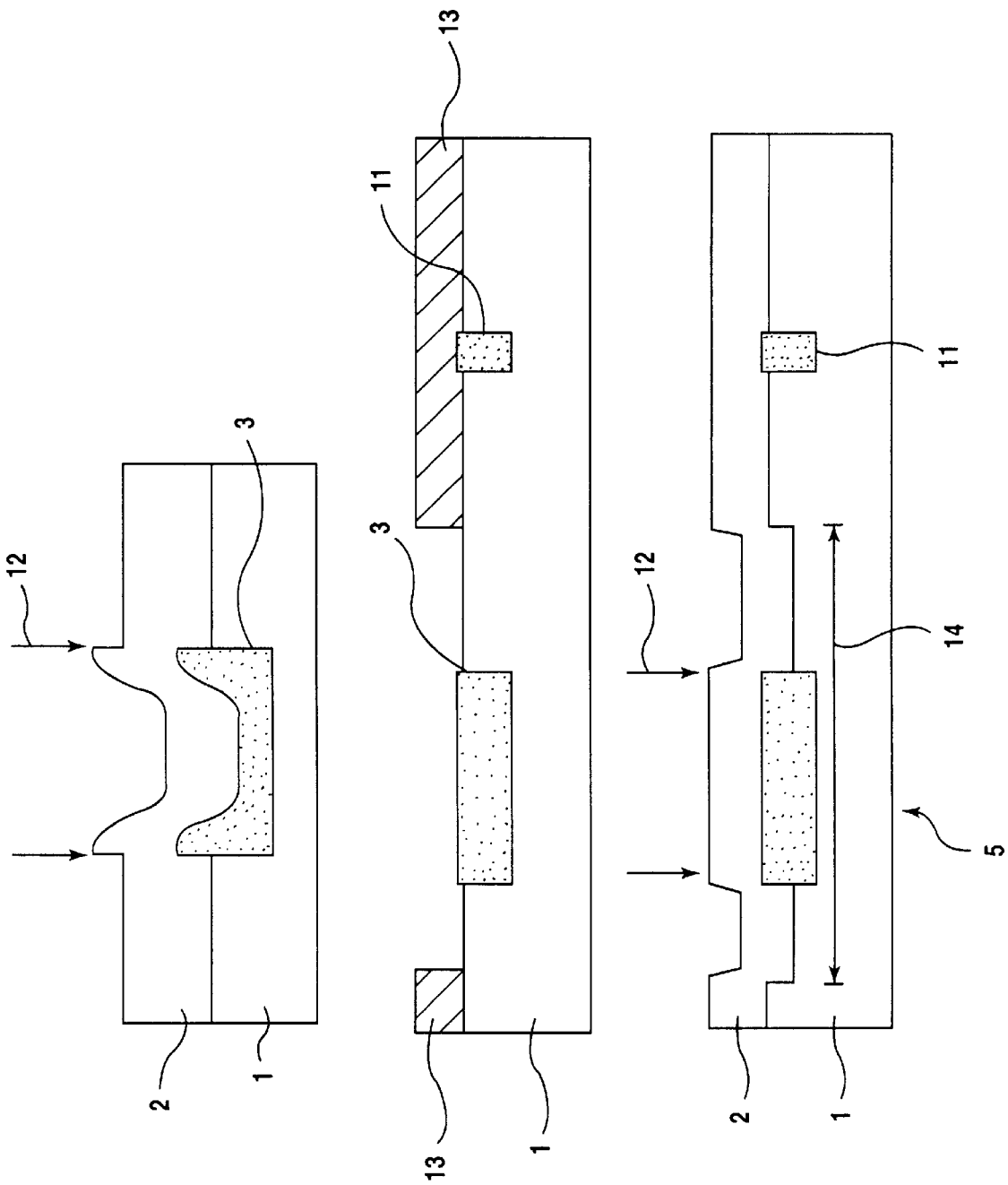

METHOD FOR IMPROVING THE READABILITY OF ALIGNMENT MARKS

BACKGROUND OF THE INVENTION

FIELD OF THE INVENTION

The invention lies in the field of semiconductor manufacture. More specifically, the invention relates to a method for improving the identifiability or readability of alignment marks on semiconductor wafers during multilayer metallization, in which the alignment marks are fabricated in the scribe line and vias or contact holes or plated-through holes to deeper metallization layers or active regions by means of a photolithographic patterning step in an oxide layer by etching and subsequent deposition of metal, and in which the semiconductor wafer is subsequently planarized in a CMP step (polishing step), with subsequent aluminum (Al) metallization.

Alignment marks are indispensable for the photolithographic processing of semiconductor wafers. Alignment marks help ensure that the masks which are necessary for exposing the photoresist on the semiconductor wafer can be aligned exactly with respect to the latter. This presupposes that the alignment marks have an exact assignment to the structures to be fabricated on the semiconductor wafer and, furthermore, offer a sufficient topographical contrast to be able to be reliably identified. After each CMP process, in particular, the identification of these alignment marks is greatly impaired due to the topographical contrast which is severely reduced or absent on account of the polishing operation. The consequence is an increased outlay on post-processing on account of the misalignment of the mask. It may even happen that alignment becomes completely impossible. This problem is becoming ever greater, however, on account of the ever decreasing structure widths and the consequentially increasing requirements made of the alignment accuracy.

In order, if possible, to circumvent or at least reduce these problems, two alternatively usable methods have been employed in the prior art.

In one of those processes, the alignment marks are located at such a depth that a topography which offers a sufficient contrast still remains after the CMP process. See FIG. 1. It is disadvantageous in that case, however, that the inner edges of the alignment marks can be displaced or flattened in an uncontrolled manner due to unavoidable asymmetric erosion of the oxide surrounding the alignment mark. An overlay error is consequently produced during wafer exposure. Such an error necessitates post processing of the semiconductor wafer. In this case, this overlay error on account of displacement of the detected edge position can occur either at the alignment marks within a wafer, or from wafer to wafer or from batch to batch.

A further disadvantage of particularly deep alignment marks may be seen in the fact that considerable quantities of particles and slurry residues may remain in the alignment marks, particularly after the CMP process, and involve the risk of contamination and an increased defect density. Since these particles can also settle on the edges of the alignment mark, this results in further flattening of the edges. The consequence is that exact alignment is at the very least made more difficult, if not even impossible. Consequently, the readability of the alignment marks cannot be improved sufficiently by that method.

In the second prior art method, an additional photoplane is used. See FIG. 2. Using the additional photoplane, a further alignment mark (auxiliary mark) is etched in the scribe line before metallization and is intended to allow better alignment after metallization due to sharper edges. This is made possible by virtue of the fact that the additional alignment mark can be aligned more easily relative to the tungsten-filled marker, owing to the fact that the material contrast between the additional alignment mark and the surrounding oxide can be utilized. The outlay for the additional photoplane and the fact that the overlay error of the two markers accumulates are disadvantageous in this case.

SUMMARY OF THE INVENTION

The object of the invention is to provide a method for improving the readability of alignment marks on semiconductor wafers for the purpose of better alignment after metallization in semiconductor manufacture, which overcomes the above-noted deficiencies and disadvantages of the prior art devices and methods of this kind, and which does not influence the functionality of the semiconductor chips to be fabricated and is also simple and cost-effective to realize. It is a further object to provide a method which simultaneously enables the defects and contamination based on particles and slurry residues to be largely eliminated.

With the above and other objects in view there is provided, in accordance with the invention, a method for improving the readability of alignment marks on semiconductor wafers during multilayer metallization, which comprises:

fabricating alignment marks on a semiconductor wafer in a semiconductor structure selected from the group consisting of a scribe line, a via hole, a contact hole, a plated-through hole to a deeper metallization layer, and an active region, by means of a photolithographic patterning step in an oxide layer by etching and subsequently depositing metal on an entire surface of the semiconductor wafer;

subsequently removing deposited metal in a polishing step, such as by CMP, and thereby retaining the metal substantially only in the alignment mark and planarizing the semiconductor wafer;

etching back the metal in the alignment marks and uncovering edges of the alignment marks; and subsequently metallizing with Al.

In other words, metal situated in the alignment marks is etched back for the purpose of uncovering the edges of the alignment marks after the deposition of metal and the subsequent CMP step. By virtue of this method, a sharply defined edge is produced in the transition from the oxide to the metal within the alignment mark, which edge can be used to effect exact and reproducible alignment of the photoplanes relative to the contact hole or via plane after metallization. In this case, the etching-back step, which is not necessary for the function of the semiconductor chip to be fabricated, produces a sharply defined edge in a simple manner. This results in a considerable reduction in the reworking rates in the critical metallization planes. In addition, there is no residual topology present after the CMP process, with the result that no particles can accumulate in the alignment marks either.

Furthermore, the possibility of misalignment due to two adjacent edges (outer or etching-back edge and inner or residual topology edge), as may be produced in the case of deeper alignment marks, is precluded.

A further advantage of the method may also be seen in the fact that this method can also be applied to existing deep markers, as a result of which the development outlay is considerably reduced.

In accordance with an added feature of the invention, tungsten is deposited during the deposition of metal in the alignment marks and the vias or contact holes, where the subsequent etching back process is effected selectively in such a way that preferentially relatively large areas are etched. The effect achieved as a result of this is that preferably the tungsten in the alignment marks is etched, since there is no desire for any etching back in the contact holes or vias.

In a continuation of the invention, the method is also wherein the etching back process is performed with high selectivity with respect to the material surrounding the alignment mark, in particular the surrounding oxide.

In accordance with an additional feature of the invention, the etching is performed in a reactive ion etching (RIE) system or in an inductive coupled plasma source (ICP) system in a $Cl_2/SF_6/NF_3$ atmosphere, which ensures sufficient etching selectivity with respect to the surrounding oxide. This etching selectivity may additionally be further improved by additive gases being added to the $Cl_2/SF_6/NF_3$ atmosphere. $O_2$ and/or $N_2$ are/is preferable as additive gases.

In accordance with an a further refinement of the invention, complete planarization of the surface of the semiconductor wafer is performed in the CMP step before the etching back process. This reliably prevents particles from being taken up.

With the above and other objects in view there is also provided an alternative embodiment of the invention, whereby the readability of the alignment marks is improved by etching back the oxide in the immediate vicinity of the alignment marks in a recess etching step until the metal in the alignment mark is partly uncovered.

This likewise makes it possible to produce a sharply defined edge at the transition from the oxide to the metal, which can be used to achieve exact and reproducible alignment of photoplanes relative to the contact hole or via plane through a non-transparent metal layer. The additional etching step, which is not necessary for the functionality of the semiconductor chip, shifts the topology used for alignment from the inner side of the marker to the outer side of the marker. This results in a considerable reduction in the reworking rates in the critical metallization planes. In addition, no residual topology remains after the CMP in this variant either, with the result that no particles can accumulate in the alignment marks. In the case of this method, it is possible to use particularly shallow alignment marks.

In accordance with again an added feature of the invention, the recess etching process is performed selectively with respect to the metal in the alignment mark and with respect to the liner, where it is preferable for a wet-chemical recess etching process using dilute hydrofluoric acid to be effected. As an alternative, the recess etching may also be performed by RIE etching or by etching from the vapor phase.

In accordance with again a further refinement of the invention, the semiconductor wafer is covered by a photoresist, the relatively close surroundings of the alignment marks being kept free. In this case, it is not necessary to impose any special accuracy requirements on the region to be kept free.

The region to be kept free for the recess etching may also be defined and patterned with the aid of standard lithography, where the exposure can be effected through a 1:1 mask on account of the inconsiderable accuracy requirements.

In accordance with a concomitant feature of the invention, the alignment marks are identified by a microscope optical arrangement and the surroundings thereof are exposed by the microscope optical arrangement.

Other features which are considered as characteristic for the invention are set forth in the appended claims.

Although the invention is illustrated and described herein as embodied in a method for improving the readability of alignment marks, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 6 is a diagrammatic view of an alignment mark with good topological contrast with recess-etched surroundings and a metallization layer;

FIG. 7 is a diagrammatic view of a shallow alignment mark after the CMP process without topological contrast, with additional photoresist; and FIG. 8 is a diagrammatic view of the alignment mark with good topological contrast according to FIG. 7 with recess-etched surroundings (oxide recess) and a metallization layer.

DESCRIPTION OF THE PREFERRED EMBODIMENTS

Figure 1:
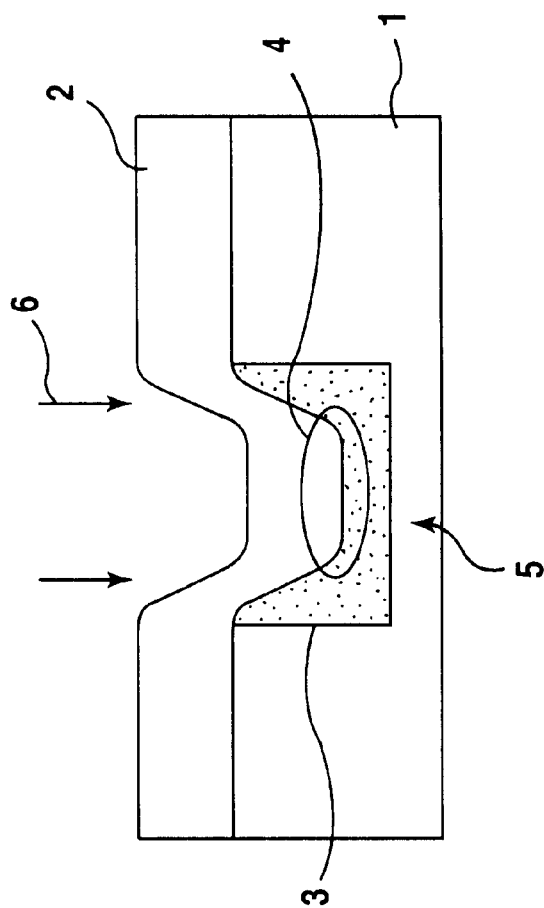
FIG. 1 is a diagrammatic view of a prior art alignment mark located particularly deep, with alignment with the inner edges of the marker.
Figure 2:
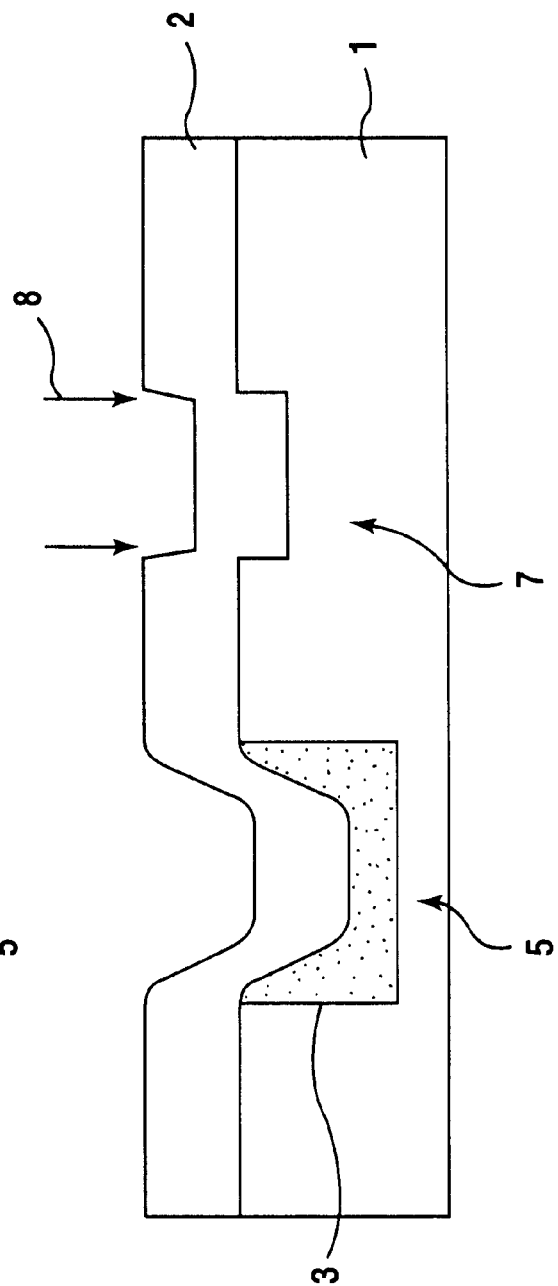
FIG. 2 is a diagrammatic view illustrating a prior art method by means of an auxiliary marker in an additional photoplane.

Referring now to the figures of the drawing in detail and first, particularly, to the prior art FIGS. 1 and 2 thereof, there are seen alignment marks 5 prepared in each case by a method from the prior art, which already reflects the endeavor to achieve better identification of the alignment mark 5. Accordingly, in the case of the alignment mark 5 according to FIG. 1, first of all a particularly deep depression was produced in the oxide 1 by photolithography and subsequent etching and then tungsten 3 was deposited on the entire wafer. The tungsten on the wafer was subsequently removed by a CMP process, with the result that only the tungsten in the depression of the alignment mark 5 remains. In this case, however, particles may also be deposited in the alignment mark 5. The corresponding region is designated by the reference symbol 4 in FIG. 1. These deposits lead to flattening of the edges, with the consequence of poor identifiability (readability), since the shape of the depression of the alignment mark 5 and thus also the edges 6 of the alignment mark are reproduced in the metallization layer 2 applied over them.

In addition, the asymmetrical erosion of the oxide 1 surrounding the alignment mark 5 leads to uncontrolled displacement of the edges 6. FIG. 2 shows the same alignment mark 5 once again, but with the latter having been assigned an auxiliary marker 7 in an additional photoplane. This auxiliary marker 7 has sharper edges, with the result that these can also be better identified in the Al metallization layer 2 situated over them.

The additional alignment mark 5 can admittedly be aligned more easily relative to the tungsten-filled marker, since the material contrast between the auxiliary marker 7 and the surrounding oxide 1 can be utilized. The fact that the overlay error of the two markers accumulates is disadvantageous in this case.

Referring now to FIGS. 3 to 8, there are shown alignment marks 5 in which significantly better identification is ensured by the application of the methods according to the invention, and in which, in particular, the problems of particles being deposited in an uncontrolled manner after the CMP process can no longer occur.

Figure 3:
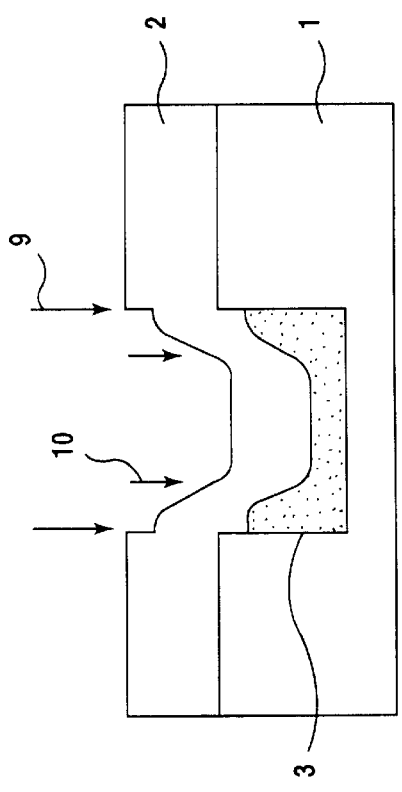
FIG. 3 is a diagrammatic view of an etched-back alignment mark with good topological contrast and with a metallization layer.
Figure 4:
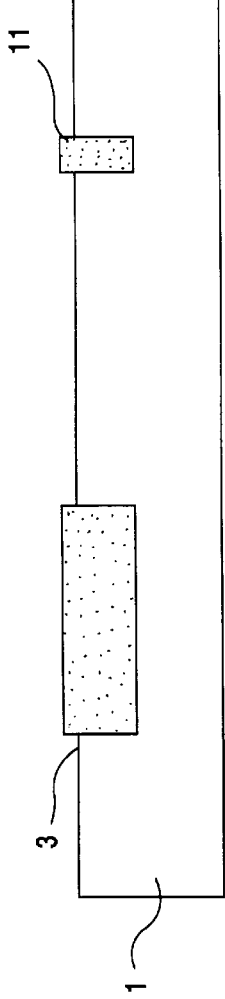
FIG. 4 is a diagrammatic view of a shallow, tungsten-filled alignment mark after the CMP process.
Figure 5:
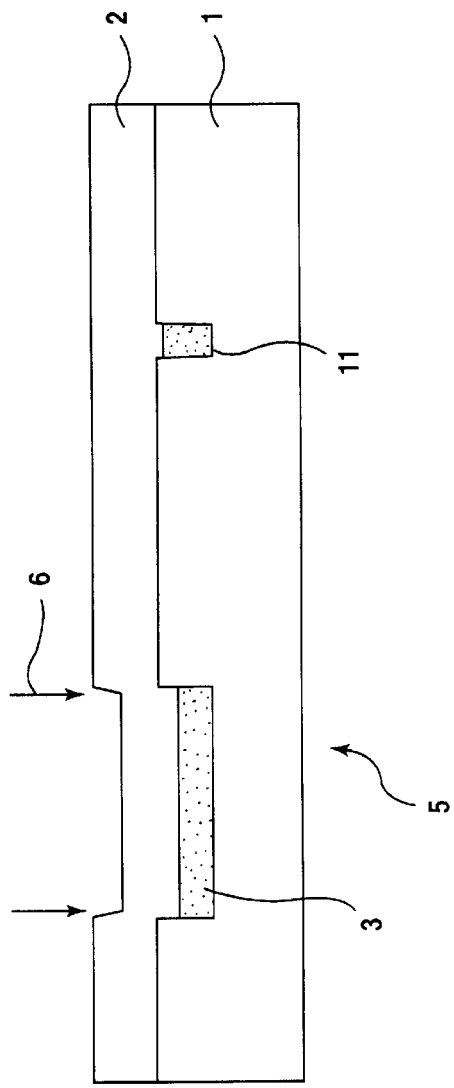
FIG. 5 is a diagrammatic view of the etched-back alignment mark with good topological contrast according to FIG. 4 with a metallization layer.

FIG. 3 shows a deep alignment mark 5 in the case of which the tungsten 3 situated in the depression in the alignment mark 5 has been etched back before Al metallization. Sharper outer edges 9 are produced in the process at the transitions to the surrounding oxide 1. This etching can be performed in a standard RIE/ICP system with a $Cl_2/SF_6/NF_3$ atmosphere, as a result of which it is possible to ensure sufficient etching selectivity with respect to the surrounding oxide 1. The etching selectivity can be further improved by the addition of additive gases, such as $O_2$ or $N_2$.

By appropriately adapting other process parameters, such as pressure, total gas flow and power, it is possible to coordinate the process in such a way as to be able to minimize undesirable etching back of the contact holes/vias 11, as is intimated in FIG. 6. In this case, the otherwise undesirable microloading effect is utilized, in which preferably relatively large areas are etched. The process of etching back the tungsten 3 in the alignment mark 5 in accordance with the invention allows the use of particularly shallow markers (FIG. 4), the depth of which corresponds approximately to the depth of the vias 11. As a consequence, the wafers can be completely planarized in the CMP process, with the result that it is no longer possible for particles to accumulate.

In this case, the subsequent etching back is effected until the edges 6 that are produced at the marker-oxide transition can be identified sufficiently well as topological contrast after Al metallization.

FIGS. 6–8 show a variant of the exemplary method according to the invention in which the oxide 1 surrounding the alignment mark 5 has been etched back by recess etching, with the result that the alignment mark 5 projects approximately 100–500 nm from the surface. In this case, the recess etching may preferably be effected wet-chemically using dilute hydrofluoric acid selectively with respect to the tungsten and with respect to the liner. The recess etching process can be applied both to shallow and to deep alignment marks 5.

FIG. 6 shows the application of the recess etching process to an existing deep alignment mark 5. The application of this method presupposes that the recess etching is restricted to the region of the alignment marks 5, since the contact holes or vias 11 are not permitted to project to such an extent from the surface.

The alignment of the recess region 14 relative to the alignment marks 5 is completely noncritical as long as the markers to be identified are detected and are not etched too far into the chip region. The recess region 14 can be seen in FIGS. 7, 8 This region is defined and patterned e.g. using standard lithography.

Since the structure widths are noncritical in this way (width of approximately 50–100 mm), more cost-effective patterning methods are also conceivable (exposure through 1:1 mask, identification and exposure by microscope optical arrangements, etc). The recess etching can also be carried out by means of an RIE step or by etching from the vapor phase.

The use of the shallow alignment mark 5 (see FIGS. 7, 8) furthermore has the advantage that no topology remains after the CMP process and, consequently, it is not possible for any contamination and particles to accumulate. In addition, only the edges to be detected are produced as contrast-affording topology.

We claim:

1. A method for improving the readability of alignment marks on semiconductor wafers during multilayer metallization, which comprises:

fabricating alignment marks on a semiconductor wafer in a semiconductor structure selected from the group consisting of a scribe line, a via hole, a contact hole, a plated-through hole to a deeper metallization layer, and an active region, by means of a photolithographic patterning step in an oxide layer by etching and subsequently depositing metal on an entire surface of the semiconductor wafer;

subsequently removing deposited metal in a polishing step, and thereby retaining the metal substantially only in the alignment mark and planarizing the semiconductor wafer;

etching back the metal in the alignment marks and uncovering edges of the alignment marks; and subsequently metallizing with Al.

2. The method according to claim 1, wherein the removing step comprises performing a CMP process step.

3. The method according to claim 1, which comprises depositing tungsten in the deposition of metal in the alignment marks and the vias or contact holes.

4. The method according to claim 1, wherein the etching back step comprises selectively etching such that large areas are etched.

5. The method according to claim 1, wherein the etching back process is performed with high selectivity with respect to the material surrounding the alignment mark.

6. The method according to claim 1, wherein the etching back process is performed with high selectivity with respect to an oxide surrounding the alignment mark.

7. The method according to claim 1, wherein the etching step comprises etching in a reactive ion etching (RIE) system in a $Cl_2/SF_6/NF_3$ atmosphere.

8. The method according to claim 7, which further comprises adding additive gas to the $Cl_2/SF_6/NF_3$ atmosphere.

9. The method according to claim 8, which comprises selecting the additive gas from the group consisting of $O_2$ and $N_2$.

10. The method according to claim 1, wherein the etching step comprises etching in an inductive coupled plasma source (ICP) system in a $Cl_2/SF_6/NF_3$ atmosphere.

11. The method according to claim 10, which further comprises adding additive gas to the $Cl_2/SF_6/NF_3$ atmosphere.

12. The method according to claim 11, which comprises selecting the additive gas from the group consisting of $O_2$ and $N_2$.

13. The method according to claim 1, wherein the planarizing step comprises completely planarizing the surface of the semiconductor wafer in a chemical-mechanical polishing step.

14. A method for improving a readability of alignment marks on semiconductor wafers during multilayer metallization, which comprises:

fabricating alignment marks on a semiconductor wafer in a semiconductor structure selected from the group consisting of a scribe line, a via hole, a contact hole, a plated-through hole to a deeper metallization layer, and an active region, by means of a photolithographic patterning step in an oxide layer by etching and subsequently depositing metal on an entire surface of the semiconductor wafer;

subsequently removing deposited metal in a polishing step, and thereby retaining the metal substantially only in the alignment mark and planarizing the semiconductor wafer;

etching back oxide in an immediate vicinity of the alignment marks in a recess etching step until the metal in the alignment mark is partly uncovered; and subsequently metallizing with Al.

15. The method according to claim 14, which comprises performing the recess etching process selectively with respect to the metal in the alignment mark and with respect to a liner.

16. The method according to claim 14, wherein the recess etching process is a wet-chemical etching process.

17. The method according to claim 14, wherein the recess etching process is an RIE etching process.

18. The method according to claim 14, which comprises performing the recess etching process from a vapor phase.

19. The method according to claim 14, which comprises covering the semiconductor wafer with a photoresist, and keeping relatively close surroundings of the alignment marks free.

20. The method according to claim 19, which comprises defining and pattering the region to be kept free for the recess etching by a standard lithography process.

21. The method according to claim 19, which comprises exposing through a 1:1 mask.

22. The method according to claim 19, which comprises identifying the alignment marks with an optical microscope configuration and exposing the surroundings thereof.

* * * * *